United States Patent
Lee et al.

(10) Patent No.: US 11,307,713 B2
(45) Date of Patent: Apr. 19, 2022

(54) TOUCH SENSING DEVICE AND METHOD FOR TOUCH SENSING

(71) Applicant: Samsung Electro-Mechanics Co., Ltd., Suwon-si (KR)

(72) Inventors: Gye Won Lee, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/066,790

(22) Filed: Oct. 9, 2020

(65) Prior Publication Data

US 2022/0050575 A1 Feb. 17, 2022

(30) Foreign Application Priority Data

Aug. 11, 2020 (KR) .................. 10-2020-0100383

(51) Int. Cl.
*G06F 3/041* (2006.01)
*G06F 3/046* (2006.01)
*G06F 3/044* (2006.01)

(52) U.S. Cl.
CPC .......... *G06F 3/04186* (2019.05); *G06F 3/046* (2013.01); *G06F 3/0447* (2019.05)

(58) Field of Classification Search
CPC .... G06F 3/04186; G06F 3/046; G06F 3/0447; G06F 2203/04105
See application file for complete search history.

(56) References Cited

U.S. PATENT DOCUMENTS

| | | | |
|---|---|---|---|
| 10,485,094 B1* | 11/2019 | Isohatala | G06F 3/0445 |
| 2009/0061928 A1* | 3/2009 | Lee | G06F 3/0362 455/556.1 |
| 2011/0167391 A1* | 7/2011 | Momeyer | G06F 3/038 715/863 |
| 2015/0002457 A1* | 1/2015 | Woo | G06F 3/0416 345/174 |
| 2015/0054774 A1* | 2/2015 | Fergusson | G06F 3/03 345/174 |
| 2017/0083126 A1* | 3/2017 | Lim | G06F 3/0416 |
| 2017/0206393 A1* | 7/2017 | Chia | G06F 21/32 |

(Continued)

FOREIGN PATENT DOCUMENTS

KR 10-1442542 B1 9/2014
KR 10-2015-0107422 A 9/2015

(Continued)

OTHER PUBLICATIONS

Korean Office Action dated Aug. 27, 2021 in the corresponding Korean Patent Application No. 10-2020-0100383 (8 pages in English and 6 pages in Korean).

(Continued)

*Primary Examiner* — Ibrahim A Khan
(74) *Attorney, Agent, or Firm* — NSIP Law

(57) ABSTRACT

A touch sensing device includes: a substrate; a first sensor disposed on the substrate; a second sensor disposed on the substrate; and a sensing circuit electrically connected to the first sensor and the second sensor. The sensing circuit is configured to compare signals sensed by the first sensor and the second sensor in accordance with an applied touch input and determine whether the applied touch input is normal.

18 Claims, 8 Drawing Sheets

(56) References Cited

U.S. PATENT DOCUMENTS

| | | | | |
|---|---|---|---|---|
| 2017/0359063 A1* | 12/2017 | Oberhauser | .......... | H03K 17/962 |
| 2018/0067590 A1* | 3/2018 | Wang | .................... | G06F 3/0412 |
| 2018/0180450 A1* | 6/2018 | Liu | ....................... | G06F 1/1626 |
| 2018/0260050 A1* | 9/2018 | Unseld | ................ | G06F 3/04166 |
| 2019/0155499 A1 | 5/2019 | Huang | | |
| 2020/0097117 A1* | 3/2020 | Sethuraman | .......... | G06F 3/0414 |
| 2020/0387224 A1* | 12/2020 | Das | ....................... | B06B 1/0207 |
| 2021/0019009 A1* | 1/2021 | Jung | .................... | G01D 5/2006 |
| 2021/0041982 A1 | 2/2021 | Hong et al. | | |
| 2021/0348766 A1 | 11/2021 | Joo et al. | | |

FOREIGN PATENT DOCUMENTS

| | | |
|---|---|---|
| KR | 10-2019-0008949 A | 1/2019 |
| KR | 10-2020-0000061 A | 1/2020 |
| KR | 10-2020-0057395 A | 5/2020 |
| KR | 10-2137092 B1 | 7/2020 |

OTHER PUBLICATIONS

Korean Office Action dated Feb. 25, 2022 in corresponding Korean Patent Application No. 10-2020-0100383 (8 pages in English and 6 pages in Korean).

\* cited by examiner

TOUCH SENSING DEVICE AND METHOD FOR TOUCH SENSING

CROSS-REFERENCE TO RELATED APPLICATIONS

This application claims the benefit under 35 U.S.C. § 119(a) of Korean Patent Application No. 10-2020-0100383 filed on Aug. 11, 2020 in the Korean Intellectual Property Office, the entire disclosure of which is incorporated herein by reference for all purposes.

BACKGROUND

The following description relates to a touch sensing device and a method for touch sensing.

In general, wearable devices having thinner, simpler and neater designs are preferred. Accordingly, existing mechanical switches are being used less frequently. This has become feasible since dustproof and waterproof technologies are being implemented and a model having a smooth design and unity of construction is being developed.

Currently, a touch-on-metal (ToM) technology implementing a touch on metal, a capacitor sensing technology employing a touch panel, micro-electro-mechanical-system (MEMS), micro strain gauge technology, and the like, are being developed. Furthermore, there is a trend of developing a force touch function.

In the case of existing mechanical switches, a large size and space are required internally to implement a switch function. Such existing mechanical switches have a shape protruding outwardly or a structure that is not formed integrally with an external case, thereby leading to disadvantages of a poor design and requiring a large internal space.

In addition, there is a risk that a user may receive an electric shock due to direct contact with the mechanical switch that may be electrically connected. In particular, there is a disadvantage in consideration of the structure of the mechanical switch that it is difficult to make dustproof and waterproof.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a touch sensing device includes: a substrate; a first sensor disposed on the substrate; a second sensor disposed on the substrate; and a sensing circuit electrically connected to the first sensor and the second sensor. The sensing circuit is configured to compare signals sensed by the first sensor and the second sensor in accordance with an applied touch input and determine whether the applied touch input is normal.

The sensing circuit may include a first oscillator circuit and a second oscillator circuit. The first oscillator circuit may be configured to generate a first oscillation signal from a change sensed by the first sensor, and the second oscillator circuit may be configured to generate a second oscillation signal from a change sensed by the second sensor.

The sensing circuit may further include a detecting circuit configured to compare the first and second oscillation signals to determine whether the applied touch input is normal.

The detecting circuit may be further configured to calculate first and second force values from the first and second oscillation signals, respectively, and compare the first and second force values to determine whether the applied touch input is normal or a malfunction.

The detecting circuit may be further configured to determine that the applied touch input is normal, in response to the first force value being greater than the second force value.

The detecting circuit may be further configured to determine that the applied touch input is normal, in response to the first force value being greater than a predetermined reference value.

The first sensor and the second sensor may be disposed in side-by-side in a direction in which a housing extends.

The first sensor and the second sensor may be disposed side-by-side in a direction perpendicular to a direction in which a housing extends.

The touch sensing device may further include a third sensor disposed on the substrate. The first sensor may be disposed between the second sensor and the third sensor.

The first sensor may include a plurality of first sensors. The plurality of first sensors may be spaced apart from each other.

A plurality of sensors including the second sensor may be disposed close to the plurality of first sensors, respectively.

In another general aspect, a method for touch sensing includes: generating a first oscillation signal and a second oscillation signal by a first sensor and a second sensor, respectively, in accordance with an applied touch input; and determining whether the applied touch input is normal by comparing the first and second oscillation signals. The first and second oscillation signals may have resonance frequencies that vary in accordance with the applied touch input.

The determining of whether the applied touch input is normal by comparing the first and second oscillation signals may include: calculating first and second force values from the first and second oscillation signals, respectively; and determining whether the applied touch input is normal or a malfunction by comparing the first and second force values.

The determining of whether the applied touch input is normal or the malfunction may include determining that the applied touch input is normal, in response to the first force being greater than the second force value.

The determining of whether the applied touch input is normal or the malfunction may include determining that the applied touch input is normal, in response to the first force value being greater than a predetermined reference value.

The method may further include: generating at least one additional oscillation signal by at least one additional sensor, in accordance with the applied touch input; and calculating at least one additional force value from the at least one additional oscillation signal. The determining of whether the applied touch input is normal or the malfunction may include determining that the applied touch input is normal, in response to the first force value being largest among the first force value, the second force value, and the at least one additional force value.

The method may further include generating an input signal to be delivered to a controller, in response to determining that the applied touch input is normal.

The method may further include determining not to generate an input signal to be delivered to a controller, in response to determining that the applied touch input is a malfunction.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
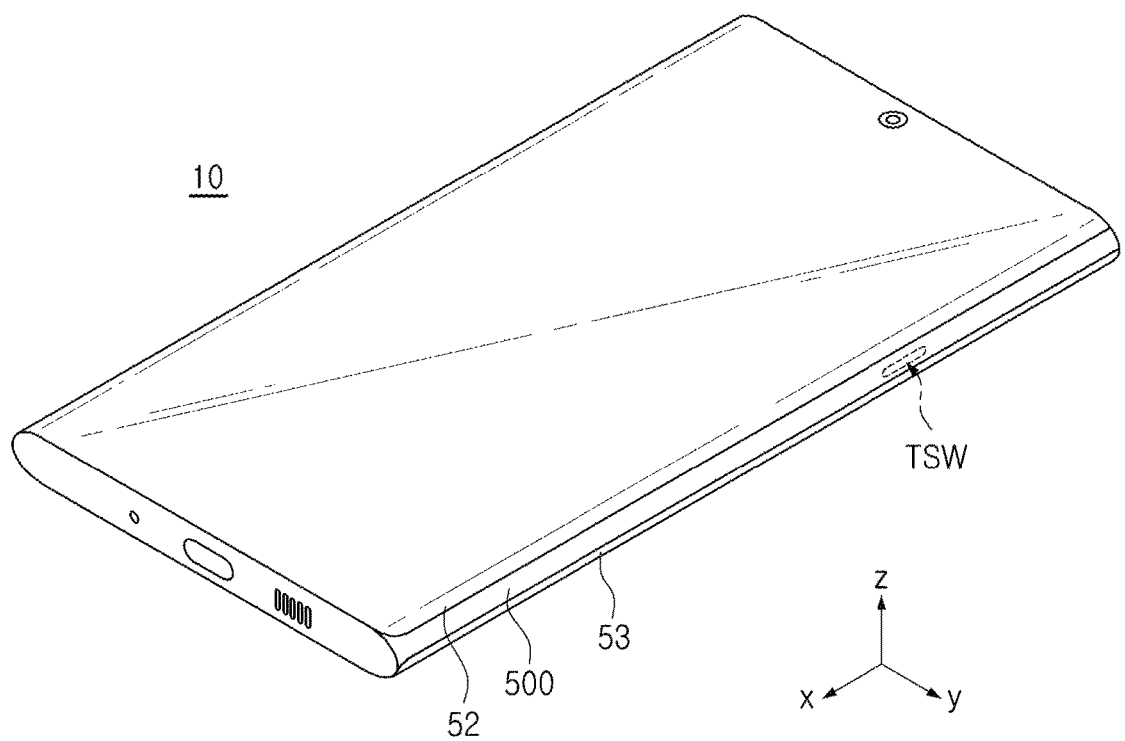
FIG. 1 is a perspective view of an exterior of an electronic device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

FIG. 1 is a perspective view of an exterior of an electronic device 10, according to an embodiment.

Referring to FIG. 1, the electronic device 10 may include a housing 500, a front display glass 52, a rear cover 53 and a touch switch TSW.

The housing 500 is, for example, a structure covering at least a portion of the electronic device 10, and may be integrally formed with a structure forming a central skeleton of the electronic device 10. The housing 500 may be formed of various materials according to types and configurations of the electronic device 10. For example, in a case in which the electronic device 10 is a smartphone, as illustrated in FIG. 1, the housing 500 may be formed of a metal frame material. Alternatively, the housing 500 may be formed of a non-conductive material, such as glass.

The front display glass 52 may be disposed on one side of the housing 500, and the rear cover 53 may be disposed on the other (e.g., opposite) side of the housing 500. That is, the electronic device 10 may include a side surface having a two-layer or three-layer structure including the front display glass 52, the housing 500 and the rear cover 53.

The touch switch TSW may be formed on the side surface of the electronic device 10 to replace a mechanical button, for example. The touch switch TSW may be a portion to which a touch input is applied. For example, the touch switch TSW may be a contact surface to which pressure is applied by a user's hand. As illustrated in FIG. 1, the touch switch TSW may be at least a portion of the housing 500.

The electronic device 10 may be a portable device, such as a smartphone, or the like, and may be a wearable device, such as a smart watch. The electronic device 10 is not limited to a specific device and may be any portable or wearable electronic device, or an electronic device having a switch for operational control.

For example, the electronic device 10 may be a smartphone, a personal digital assistant (PDA), a digital video camera, a digital still camera, a network system, a computer, a monitor, a tablet PC, a laptop PC, a netbook PC, a television, a video game machine, a smart watch, an automotive component, or the like, but is not limited to the foregoing examples.

In the case of a conventional electronic device such as a conventional mobile phone, a volume button or a power button may be formed on a side surface thereof as a physical button (key). In this case, the physical button may protrude outwardly to be pressed by a user's hand. Use of such a physical button, however, is disadvantageous in that there is a longevity issue due to abrasion and it is difficult to waterproof the physical button.

To compensate for such disadvantages, a touch sensing switch has been developed. However, a conventional touch sensing switch has a limitation that it cannot distinguish force unintentionally applied to a region other than the switch from a normal touch input operation, thereby causing a malfunction. Embodiments of a touch sensing device and a method for touch sensing that overcome this limitation will be described with reference to FIGS. 2 to 9.

In describing the drawings herein, unnecessarily repetitive descriptions for the same reference numerals and components having the same function may be omitted, and possible differences for each drawing may be described.

Figure 2:
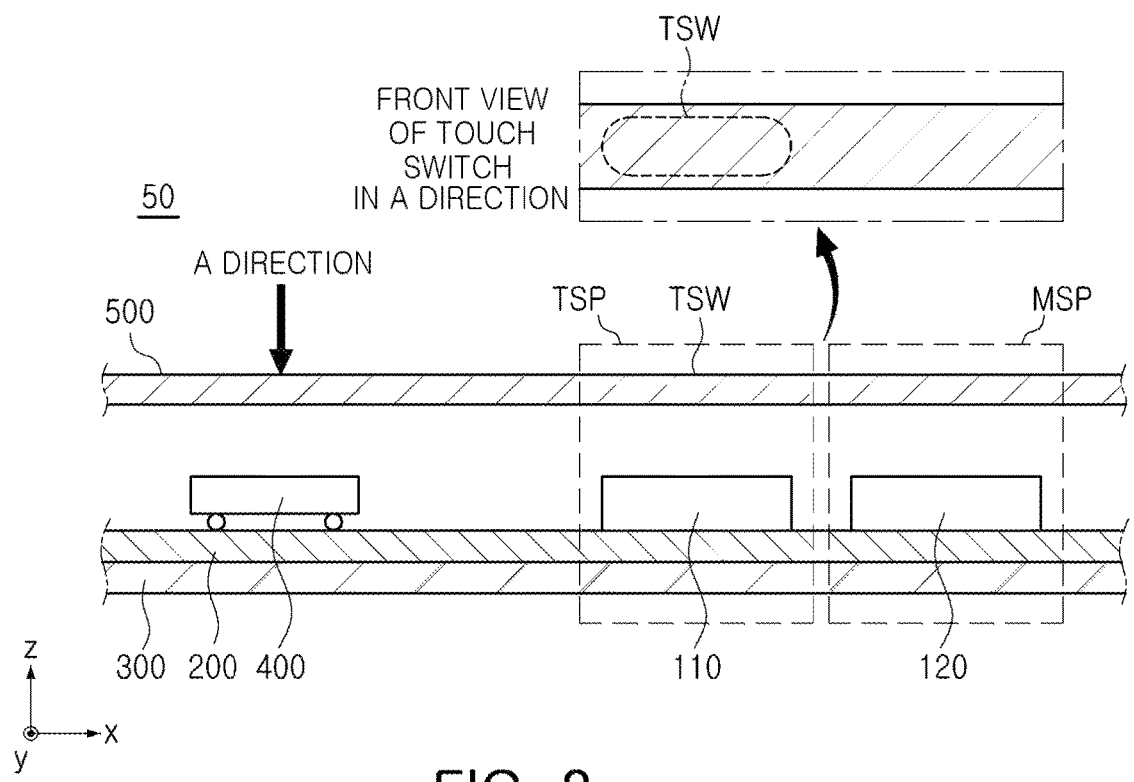
FIG. 2 is a diagram illustrating a cross-sectional structure (X-Z plane) of a touch sensing device, according to an embodiment.

FIG. 2 is a diagram illustrating a cross-sectional structure (X-Z plane) of a touch sensing device 50, according to an embodiment. Referring to FIG. 2, a basic concept of the disclosure herein is to implement the touch sensing device 50 to sense a degree of bending of the housing 500 inwardly when pressure is applied to the touch switch TSW, to enable a touch to be input to be applied without a physical button on the side surface of the electronic device 10.

As described above, the electronic device 10 (e.g., a modern smartphone, or the like) includes the housing 500 (e.g., a metal frame) disposed in a center thereof and the front display glass 52 disposed in an upper portion thereof, as well as the rear cover 53 disposed in a lower portion thereof. In this case, the rear cover 53 may be, for example, a back glass.

Referring to FIGS. 1 and 2, the housing 500 may include the touch switch TSW in at least a portion thereof. In addition, the electronic device 10 may include the touch sensing device 50, and the touch sensing device 50 may be inserted inside the housing 500. The touch sensing device 50 may sense external force applied to the touch switch TSW.

The touch sensing device 50 is an apparatus capable of detecting a touch input. In the detailed descriptions herein, a touch, a touch input and touch application may include a contact touch, which is a touch in which contact is made without force, and a force touch, which is a touch in which a contact is made with a pressing force (pressure). Hereinafter, a force touch input sensed by inductive sensing will be mainly described.

An operation of a sensor by an inductive sensing method described herein is merely an example, and various sensing methods (for example, capacitive sensing method, inductive sensing method, or a hybrid sensing method employing the capacitive and inductive sensing methods), which can be carried out by those skilled in the art, may be employed.

Referring to FIG. 2, the touch sensing device 50 may include, for example, a first sensor 110, a second sensor 120, a substrate 200, a bracket 300 and a sensing circuit 400. The bracket 300 may be excluded or replaced with another structure, according to embodiments.

The substrate 200 may be spaced apart from the inner side of the housing 500. In this case, only the first sensor 110 is disposed in a position opposing (e.g., overlapping in the vertical (Z) direction) the touch switch TSW, which is formed in the housing 500, and the second sensor 120 may be disposed in a position not opposing the touch switch TSW.

For example, as illustrated in FIG. 2, the first sensor 110 and the second sensor 120 may be spaced apart from the housing 500 inside the housing 500. In this case, the first sensor 110 is disposed in the position opposing the touch switch TSW formed in the housing 500 while the second sensor 120 is disposed close to the first sensor 110. This results in the second sensor being disposed not to directly oppose the touch switch TSW.

As illustrated in FIG. 2, the first sensor 110 may be disposed to completely overlap (e.g., in the Z direction) the touch switch TSW (e.g., in the Z direction), and the second sensor 120 may be disposed not to overlap (e.g., in the Z direction) the touch switch TSW; however, this is merely an example. That is, overlapping areas of the first sensor 110 and the second sensor 120 may vary depending on a size, a range, or the like, of the touch switch TSW.

For example, the first sensor 110 may be disposed to overlap with 90% of an entire surface area of the touch switch TSW, and the second senor 120 may be disposed to overlap with 10% of the entire surface area of the touch switch TSW. In this case, a percentage of the area in which a plurality of the sensors overlap the touch switch TSW may vary, but may be adjusted within a range in which a change by pressure applied to the touch switch TSW is indicated to be larger in the first sensor 110 than in the second sensor 120.

The user of the electronic device 10 may apply a force to the touch switch TSW to apply a touch input, and the touch input applied by the user may affect both first sensor 110 and second sensor 120 at the same time. That is, when the user applies a force to one region of the housing 500, the housing 500 bends inwardly where the substrate 200 is disposed. In this case, a distance between the housing 500 and the first sensor 110 and a distance between the housing 500 and the second sensor 120 may be reduced.

For example, in a case in which the user applies a force to the touch switch TSW, a distance between the housing 500 and the first sensor 110, which is disposed in the position opposing the touch switch TSW, may be reduced by a greater amount than a distance between the housing 500 and the second sensor 120 is reduced. In contrast, in the case in which the user applies a force to a region of the housing 500 in a position opposing the second sensor 120, a distance between the housing 500 and the second sensor 120 may be reduced by a greater amount than the distance between the housing 500 and the first sensor 110 is reduced.

In the above example, such a change aspect is used to compare the distances between the housing 500 and the first and second sensors 110 and 120, thereby distinguishing the region of the housing to which the user applies a force. That is, in a case in which there is a greater change in the distance between the first sensor 110 and the housing 500, it is determined that the user applies a normal touch input to the touch switch TSW, whereas, in a case in which there is a greater change in the distance between the housing 500 and the second sensor 120, it is determined that the user applies unintentional pressure to a region other than the touch switch TSW.

Hereinafter, the expression "touch sensing portion TSP" refers to a region including a region in which the touch switch TSW is formed and a region in which the first sensor 110 is disposed, and the expression "malfunction sensing portion (MSP)" refers to a region including a region in which the touch switch TSW is not formed and a region in which the second sensor 120 is disposed.

That is, in the touch sensing device 50, when the user applies a touch input to the touch sensing portion TSP, the distance between the housing 500 and the first sensor is reduced and thus is determined as a normal touch input. Alternatively, when the user applies a touch input to the malfunction sensing portion MSP, the distance between the second sensor 120 and the housing 500 is reduced and thus is determined as a malfunction.

Even when pressure is applied to the touch switch TSW, there may be a case in which the user unintentionally applies a touch input. For example, the user may mistakenly touch the touch switch TSW while hand-carrying the electronic device 10. To determine such an unintentional operation as a malfunction, the electronic device 10 may have a reference value for distinguishing a normal touch input set in advance. That is, the touch input is recognized as a normal touch input only in a case in which pressure above the predetermined reference value is applied to the touch switch TSW.

In an example, the touch sensing device 50 may determine whether the user has applied pressure the touch switch TSW by comparing the change in the distance between the housing 500 and the first sensor 110 with the change in the distance between the housing 500 and the second sensor 120, and may be set to recognize the touch input as a normal touch input only when the pressure applied to the touch switch TSW is above the reference value.

The touch sensing device 50 may include the substrate 200 mounted with the first sensor 110 and the second sensor 120 disposed thereon. The substrate 200 may be a flexible printed circuit board (FPCB), but is not limited thereto. That is, various types of substrates having a structure in which at least one metal layer and at least one wiring layer are alternately stacked may be used as the substrate 200. A plurality of sensors including the first and second sensors 110 and 120 may be electrically connected to each other by the substrate 200. The plurality of sensors and the sensing circuit 400, to be described in more detail below, may be connected to each other by the substrate 200.

Further, according to an example, the touch sensing device 50 may include the bracket 300 supporting the substrate 200 such that a predetermined distance is provided between the housing 500 and the first and second sensors 110 and 120. That is, in a case in which the user does not apply pressure to the housing 500, the predetermined distance between the housing 500 and a plurality of the sensors may be maintained by the bracket 300.

The bracket 300 may be a conductor such as a metal, but is not limited thereto. The bracket 300 may be attached to an internal structure of the electronic device 10 having the touch sensing device 50 applied thereto and may be supported by an additional support member. The bracket 300 is not limited to having a particular structure as long as the structure maintains the predetermined distance between the housing 500 and a plurality of the sensors while supporting the substrate 200.

According to an example, the touch sensing device 50 may include the sensing circuit 400 electrically connected to the first and second sensors 110 and 120. The sensing circuit 400 may be configured to compare signals sensed by the first and second sensors 110 and 120 and determine whether a touch input is normal, upon application of the touch input. That is, the sensing circuit 400 may be configured to determine whether the pressure applied by the user is a normal touch input or a touch input due to a malfunction.

Further, in the case in which the touch input is determined to be a normal touch input, the sensing circuit 400 may generate an input signal for the touch input to deliver to one or more other elements or components of the electronic device 10. For example, the sensing circuit 400 may generate an input signal to deliver to a control module (or controller) 60 (illustrated in FIG. 4) of the electronic device 10. The control module 60 may be a module configured to allow a functional operation of the electronic device 10 to be performed based on input signals delivered from various input apparatuses included in the electronic device 10. That is, the control module 60 may be implemented by any configuration of elements or components capable of controlling an operation of the electronic device 10 depending on the input signal, without being limited to a particular name or structure.

Figure 4:
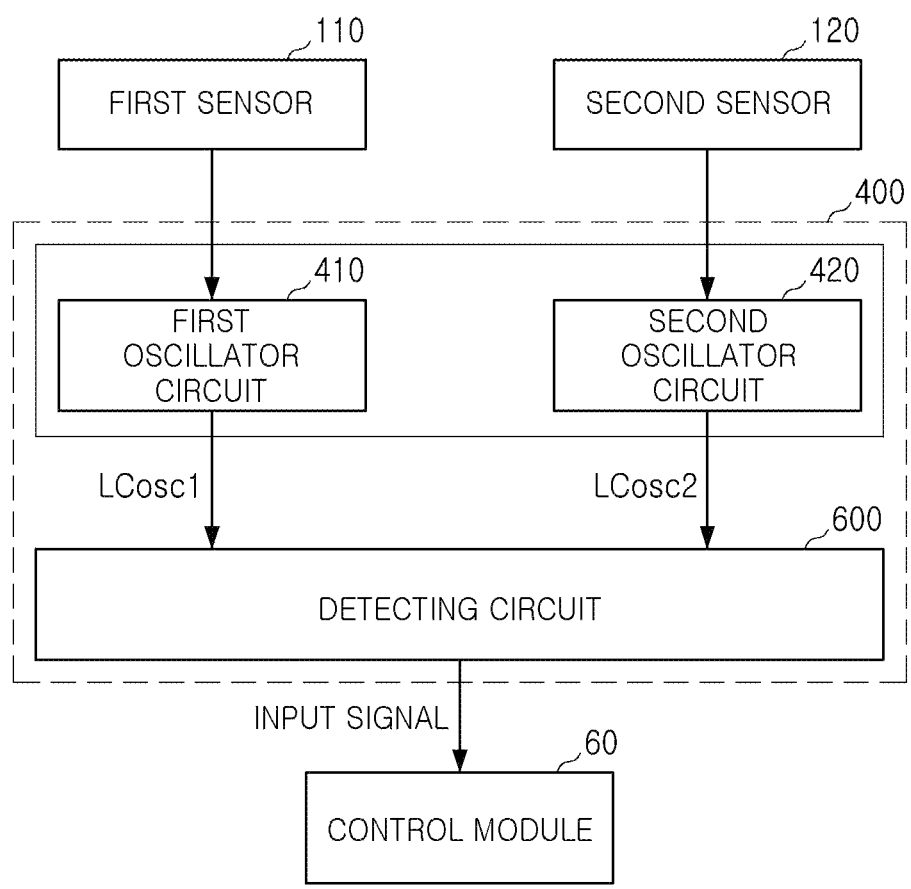
FIG. 4 is a schematic diagram illustrating an operational mechanism of a touch sensing device, according to an embodiment.

The sensing circuit 400 may include a plurality of oscillator circuits (e.g., including a first oscillator circuit 410 and a second oscillator circuit 420, illustrated in FIG. 4) and a detecting circuit 600 (illustrated in FIG. 4). The plurality of oscillator circuits may be electrically connected to a plurality of the sensors including the first and second sensors 110 and 120. Alternatively, the detecting circuit 600 may be electrically connected to a plurality of the oscillator circuits and may analyze signals received from each of the oscillator circuits. An example internal configuration of the sensing circuit 400 is illustrated in FIG. 4, which will be described in more detail below.

Figure 3A:
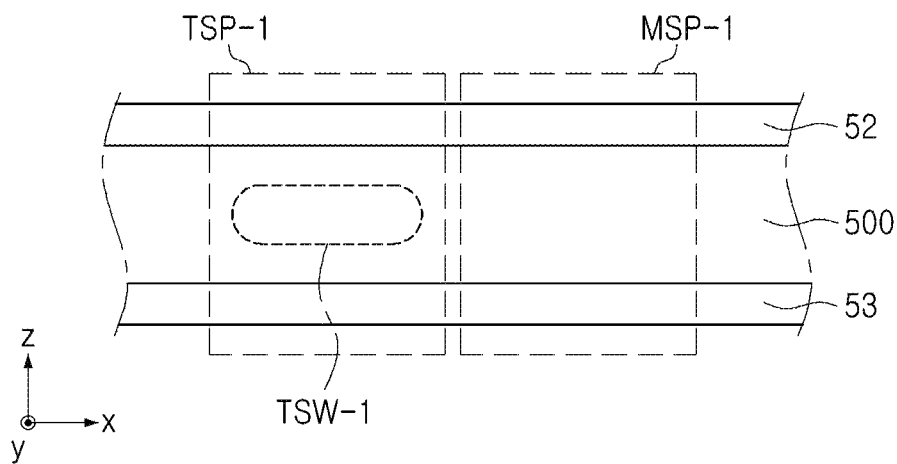
FIGS. 3A and 3B are diagrams illustrating enlarged views of one side surface of the electronic device of FIG. 1, according to embodiments.
Figure 3B:
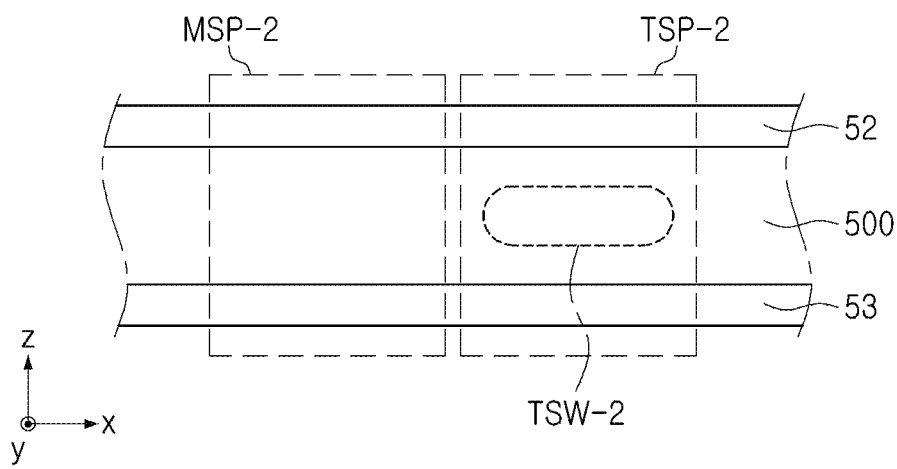

FIGS. 3A and 3B are diagrams illustrating enlarged views of one side surface of the electronic device of FIG. 1, according to embodiments.

Referring to FIGS. 3A and 3B, a relationship of the touch switch TSW formed in the housing 500 with the touch sensing portion TSP and the malfunction sensing portion MSP is illustrated. As illustrated in FIGS. 3A and 3B, the electronic device 10, to which the touch sensing device 50 is applied, may include the touch sensing portion TSP including a portion in which the touch switch TSW is formed and the malfunction sensing portion MSP excluding the region in which the touch switch TSW is formed.

As illustrated in FIG. 3A, in a case in which a first touch switch TSW-1 is formed in a left side of the housing 500, the left side of the housing 500 can be classified as a first touch sensing portion TSP-1. In addition, a right side excluding the left side can be classified as a first malfunction sensing portion MSP-1.

In the case in which the housing 500 is configured as shown in FIG. 3A, the first sensor 110 may be disposed in an internal region of the housing 500 corresponding to the first touch sensing portion TSP-1, and the second sensor 120 may be disposed in an internal region of the housing 500 corresponding to the first malfunction sensing portion MSP-1. In this regard, the sensing circuit 400 may recognize that a distance between the first sensor 110 and the housing 500 is reduced when a touch input is applied to the first touch switch TSW-1 and may determine that the touch input is a normal touch input. In the case in which a touch input is applied to a region biased toward a right side as compared to the first touch switch TSW-1, a distance between the second sensor 120 and the housing 500 is recognized as being reduced, thereby causing the touch input to be distinguished as a malfunction.

As previously described, the arrangements of the first sensor 110 and the second sensor 120 may be adjusted depending on the size, range, or the like, of the first touch switch TSW-1. That is, the area of the second sensor 120 overlapping with the first sensor 110, opposing the first touch switch TSW-1, may vary. In this case, a percentage of a plurality of the sensors overlapping with the first touch switch TSW-1 may vary, but needs to be adjusted within the range in which a change due to pressure applied to the first touch switch TSW-1 is larger in the first sensor 110 than the second sensor 120.

As the arrangements of the first and second sensors 110 and 120 are adjusted, a region including the first sensor 110 is determined as the first touch sensing portion TSP-1, and a region including the second sensor 120 is determined as the first malfunction sensing portion MSP-1. In this regard, the first touch sensing portion TSP-1 and the first malfunction sensing portion MSP-1 may be narrower than the case in which the first touch sensing portion TSP-1 and the first sensor 110 completely overlap.

The malfunction sensing portion MSP may be provided on the left side of the touch switch TSW, not on the right side thereof. That is, the arrangement of the second sensor 120 may vary with respect to the first sensor 110 depending on the shape, structure, or functional needs of the electronic device 10, thereby adjusting a location and a range of a malfunction distinguishing region of the electronic device 10.

As illustrated in FIG. 3B, in a case in which a second touch switch TSW-2 is formed on the right side of the housing 500, the right side of the housing 500 may be distinguished as a second touch sensing portion TSP-2. In addition, the left side, excluding the right side, may be distinguished as a second malfunction sensing portion MSP-2.

In the case in which the housing 500 is configured as illustrated in FIG. 3B, the first sensor 110 may be disposed in an internal region of the housing 500 corresponding to the second touch sensing portion TSP-2, and the second sensor 120 may be disposed in an internal region of the housing 500 corresponding to the second malfunction sensing portion MSP-2. In this regard, the sensing circuit 400 may determine that a distance between the first sensor 110 and the housing 500 is reduced when a touch input is applied to the second touch switch TSW-2, thereby distinguishing the touch input as a normal touch input. When a touch input is applied to a region on the left side of the second touch switch TSW-2, the sensing circuit 400 may determine that a distance between the second sensor 120 and the housing 500 is reduced, thereby distinguishing the touch input as a malfunction.

In addition, both sides of the touch sensing portion TSP in which the touch switch TSW is formed may be set as the malfunction sensing portions MSP. That is, the first sensor 110 may be disposed inside the housing 500 in a region corresponding to the touch sensing portion TSP, and a plurality of sensors may be provided on both sides of the first sensor 110. In this case, a range of distinguishing a malfunction of the electronic device 10 with respect to the touch switch TSW may be increased by adjusting a number of the sensors included in the malfunction sensing portion MSP. That is, the malfunction sensing portion MSP broadens when the number of a plurality of the sensors, disposed in parallel with the first sensor 110, increases, thereby enabling the sensing circuit 400 to distinguish strong pressure applied to a region far from the touch switch TSW as a malfunction. Depending on the shape, structure, or functional needs of the electronic device 10, a smaller number of the sensors may be disposed on one side of the touch sensing portion TSP to narrow the malfunction sensing portion MSP and a larger number of the sensors may be disposed on the other side to broaden the malfunction sensing portion MSP.

FIG. 4 is a schematic diagram illustrating an operational mechanism of a touch sensing device, according to an embodiment.

As illustrated in FIG. 4, the sensing circuit 400 may include, for example, the first oscillator circuit 410, the second oscillator circuit 420, and the detecting circuit 600. The first and second oscillator circuits 410 and 420 may generate an oscillation signal as a touch input is applied to the touch switch TSW. Further, the detecting circuit 600 may receive the oscillation signals generated by the first and second oscillator circuits 410 and 420 and may use the received oscillation signals as a basis of determining whether the touch input is normal.

The first and second sensors 110 and 120 may be configured to employ various types of sensing methods, for example, an inductive sensing method. In this case, the first and second sensors 110 and 120 may each include a sensing coil disposed on the substrate 200. The sensing coil may be a winding coil or may be formed of a PCB coil pattern.

An example in which the first and second sensors 110 and 120 are operated by the inductive sensing method will be described with reference to FIG. 6.

Figure 6:
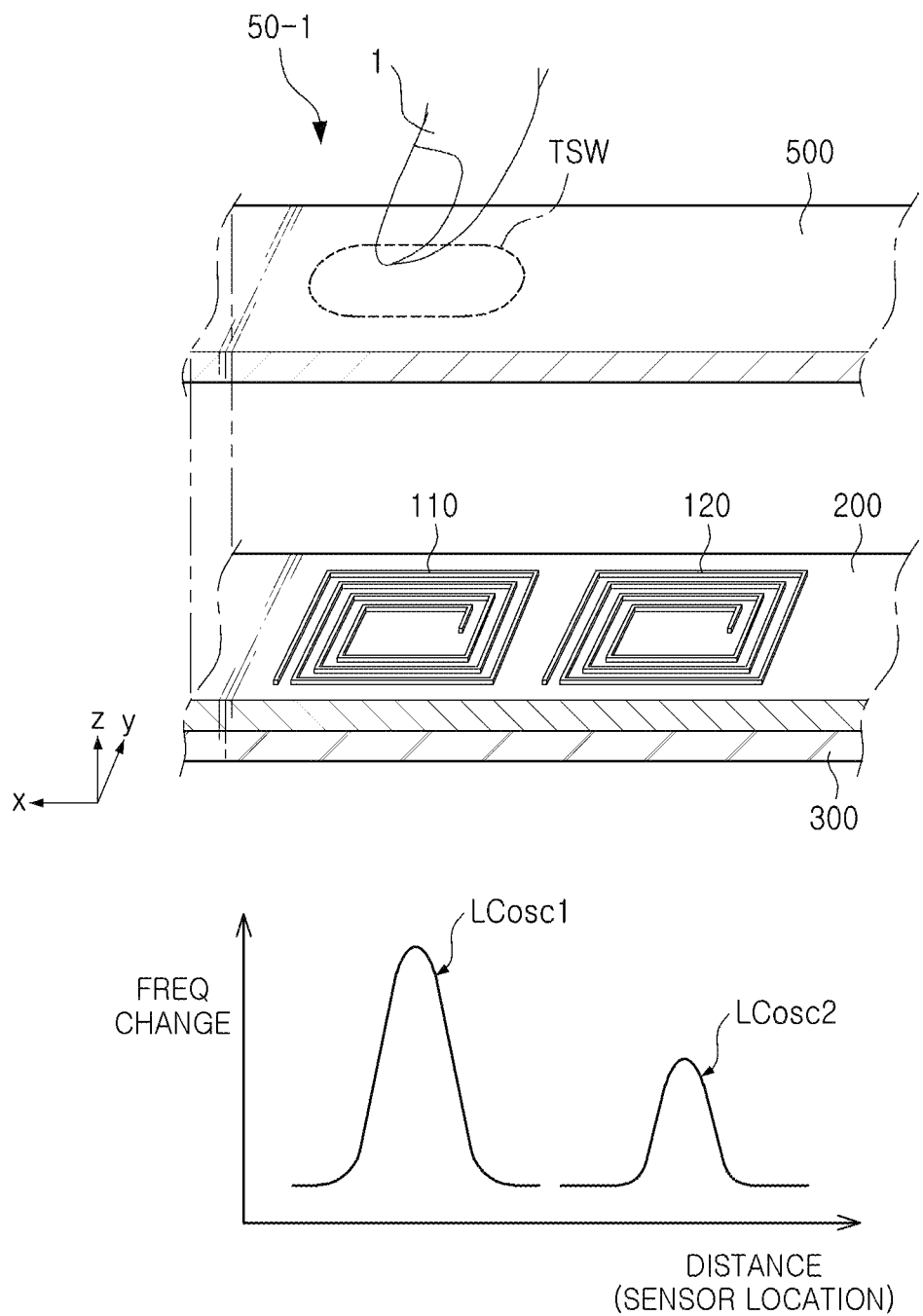
FIG. 6 is a partial perspective view of a touch sensing device, according to an embodiment, and a graph illustrating a change in frequency sensed by first and second sensors of the touch sensing device.

FIG. 6 is a partial perspective view of a touch sensing device 50-1, according to an embodiment and a graph illustrating a change in frequency sensed by the first and second sensors 110 and 120.

Specifically, FIG. 6 illustrates the touch sensing device 50-1 in which the first and second sensors 110 and 120 are disposed side-by-side. Referring to FIGS. 4 and 6, the sensing coils of the first and second sensors 110 and 120 may be spaced apart from the housing 500 by a predetermined distance. Each sensing coil may have inductance varying in accordance with a touch input applied to the touch switch TSW by a user's hand 1. The first oscillator circuit 410 may generate a first oscillation signal LCosc1 having an oscillation frequency based on varying inductance or capacitance. Further, the second oscillator circuit 420 may generate a second oscillation signal LCosc2 having an oscillation frequency based on varying inductance or capacitance.

In this case, the first oscillator circuit 410 may generate the first oscillation signal LCosc1 by implementing the sensing coil included in the first sensor 110 and a capacitor element connected to the sensing coil in parallel, series, or series-parallel. Further, the second oscillator circuit 420 may generate the second oscillation signal LCosc2 by implementing the sensing coil included in the second sensor 120 and a capacitor element connected to the sensing coil in parallel, series, or series-parallel.

For example, when pressure is applied to the touch switch TSW by a conductor or a non-conductor, the housing 500 bends inwardly, thereby changing a distance between the housing 500 and the sensing coil included in the first sensor 110. While a current flows through the sensing coil of the first sensor 110, a distance from sensing coil of the first sensor 110 to the housing 500, which is a nearby conductor, changes, thereby changing a magnitude of an eddy current. Inductance changed by the eddy current may then be reduced (Lind−ΔLind), and the oscillation frequency of the first oscillation signal LCosc1 may increase. Similarly, as the housing 500 bends inwardly, the distance from the sensing coil included in the second sensor 120 to the housing 500 changes. While a current flows through the sensing coil of the second sensor 120, and the distance from the housing 500, which is a nearby conductor, to the sensing coil of the second sensor 120 changes, a magnitude of an eddy current changes. Inductance changed by the eddy current may then be reduced (Lind−ΔLind), and the oscillation frequency of the second oscillation signal LCosc2 may also increase.

The detecting circuit 600 may analyze the first and second oscillation signals LCosc1 and LCosc2 to determine whether a touch input by a user is normally applied to the touch switch TSW. That is, the detecting circuit 600 compares the oscillation frequency of the first oscillation signal LCosc1 with the oscillation frequency of the second oscillation signal LCosc2 in accordance with the touch input applied to the electronic device 10 to determine whether the touch input is normal or a malfunction.

As an example, when a touch input is applied to the touch switch TSW, an amount of the inductance reduced by the first sensor 110 is measured to be larger than that by the second sensor 120. In this regard, as illustrated in FIG. 6, the oscillation frequency of the first oscillation signal LCosc1 may increase by a larger amount than the oscillation frequency of the second oscillation signal LCosc2 increases. The detecting circuit 600 may then distinguish the sensor showing the oscillation frequency increased by a larger amount as the first sensor 110.

When the touch input is determined to be a normal touch input, the detecting circuit 600 may generate an input signal in accordance with the corresponding touch input and transfer the generated input signal to the control module 60 of the electronic device 10. In contrast, when the touch input is determined to be a touch input due to a malfunction, the detecting circuit 600 may not generate an input signal.

Figure 5:
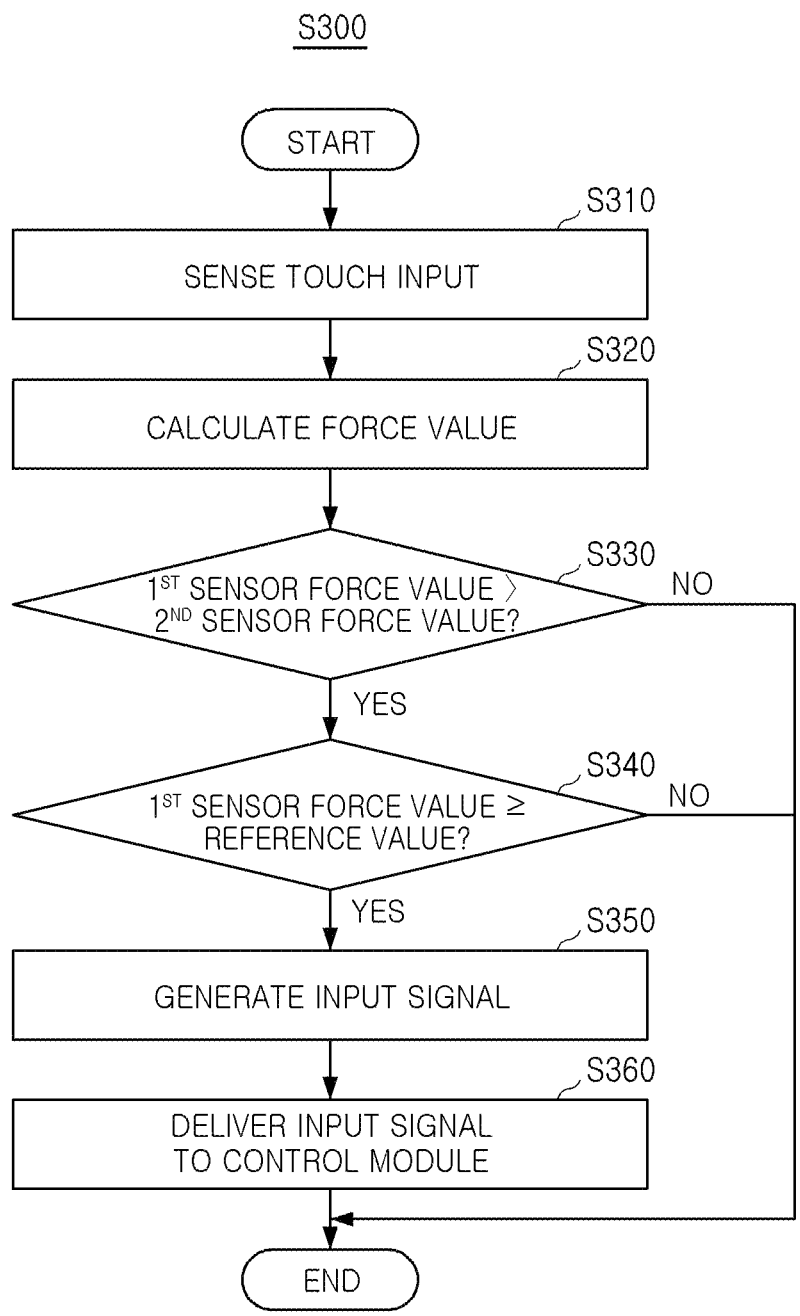
FIG. 5 is a diagram illustrating an operation of a touch sensing method, according to an embodiment.

FIG. 5 is a diagram illustrating an operation of a touch sensing method S300, according to an embodiment.

Referring to FIG. 5, the touch sensing method S300 includes detecting a touch input applied to the touch switch TSW of the electronic device 10 in operation S310, and calculating a force value from the touch input in operation S320. That is, when the first and second oscillation signals are generated by first and second oscillator circuits 410 and 420, respectively, the detecting circuit 600 may calculate a force value therefrom in accordance with the touch input.

When a force value sensed by the first sensor 110 is calculated from the first oscillation signal LCosc1 and a force value sensed by the second sensor 120 is calculated from the second oscillation signal LCosc2, the force values sensed by the first and second sensors 110 and 120 may be compared. For example, the detecting circuit 600 may determine whether the force value sensed by the first sensor 110 is larger than the force value sensed by the second sensor 120, in operation S330.

When the force value sensed by the first sensor 110 is larger than the force value sensed by the second sensor 120, a corresponding touch input may be distinguished as a normal touch input. In contrast, when the force value sensed by the first sensor 110 is not larger than the force value sensed by the second sensor 120, the touch input may be distinguished as a malfunction applied to a malfunction sensing portion MSP. The detecting circuit 600 then may not generate an input signal.

When the force value sensed by the first sensor 110 is larger than the force value sensed by the second sensor 120, the detecting circuit 600 may determine whether the force value sensed by the first sensor 110 is equal to or higher than a predetermined reference value, in operation S340. When the force value sensed by the first sensor 110 is higher than the predetermined reference value, the corresponding touch input may be distinguished as a normal touch input.

In addition, in operation S350, the detecting circuit 600 may generate an input signal based on the touch input being distinguished as normal and may transfer the input signal to the control module 60 in operation S360. That is, by generating and transferring the input signal, an output operation for a particular function of the electronic device 10 may be performed by the normal touch input of the user.

In contrast, when the force value sensed by the first sensor 110 is not larger than the predetermined reference value, the corresponding touch input may be distinguished as a malfunction caused by a user's mistake, and no input signal is generated by the detecting circuit 600.

Figure 7:
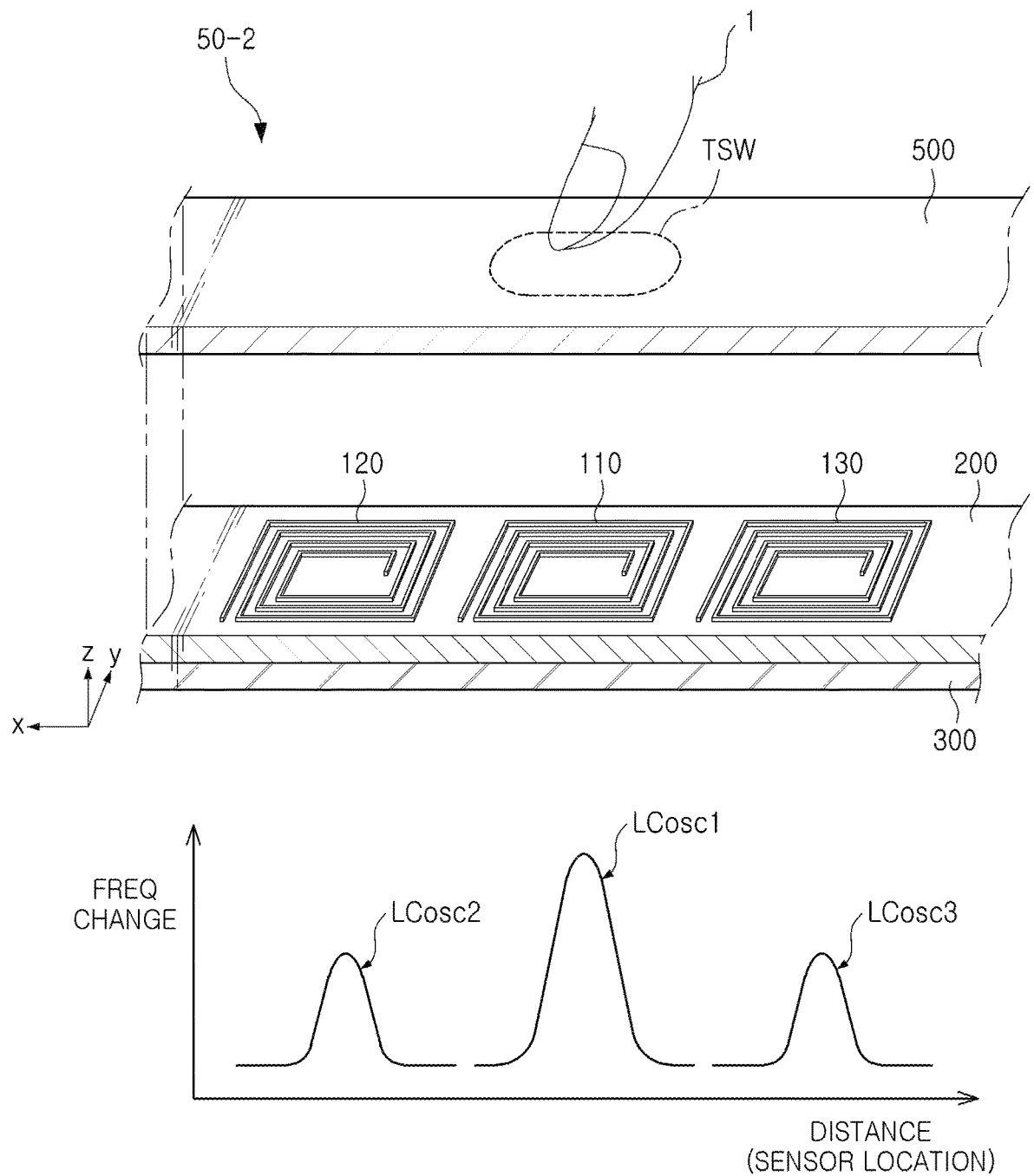
FIG. 7 is a partial perspective view of a touch sensing device, according to an embodiment, and a graph illustrating a change in frequency sensed by first, second, and third sensors of the touch sensing device.

FIG. 7 is a partial perspective view of a touch sensing device 50-2, according to an embodiment, and a graph illustrating a change in frequency sensed by the first sensor 110, the second sensor 120, and a third sensor 130 of the touch sensing device 50-2.

Specifically, FIG. 7 illustrates the touch sensing device 50-2, in which the first, second, and third sensors 110, 120, and 130 are disposed side-by-side. That is, in comparison to the embodiment of FIG. 6, the touch sensing device 50-2 may further include the third sensor 130 in addition to the first and second sensors 110 and 120. The third sensor 130 may be disposed in parallel (e.g., side-by-side) with the first and second sensors 110 and 120 on the substrate 200, and the third sensor 130 may be disposed in a position not opposing a touch switch TSW. The first sensor 110 may be disposed between the second sensor 120 and the third sensor 130.

To describe the above in terms of the previously described touch sensing portion TSP and the malfunction sensing portion MSP, the region in which the first sensor 110 and the touch switch of the housing 500 are disposed is the touch sensing portion TSP, and the region in which the second and third sensors 120 and 130 on both sides of the touch switch TSW of the housing 500 are disposed is the malfunction sensing portion MSP. In this case, when a user applies a touch input to a region to the left or right of the touch switch TSW, the touch sensing device 50-2 may distinguish the touch input as a malfunction.

As illustrated in FIG. 7, the sensing coil of the first sensor 110, and the sensing coils of the second and third sensors 120 and 130 may be spaced apart from the housing 500 by a predetermined distance. Each sensing coil may have inductance varying in accordance with a touch input by the user's hand 1 to the touch switch TSW. A plurality of oscillator circuits electrically connected to the sensors may generate oscillation signals having oscillation frequencies based on the varying inductance or capacitance. That is, first, second, and third oscillation signals LCosc1, LCosc2, and LCosc3 may be respectively generated by the first, second, and third sensors 110, 120, and 130.

For example, when pressure is applied to the touch switch TSW by a conductor or a non-conductor, the housing 500 bends inwardly, thereby changing a distance from the sensing coil included in the first sensor 110 to the housing 500. While a current flows through the sensing coil included in the first sensor 110, a distance from the sensing coil of the first sensor 110 to the housing 500, which is a nearby conductor, changes, thereby changing a magnitude of an eddy current. Inductance changed by the eddy current may then be reduced (Lind−ΔLind), and the oscillation frequency of the first oscillation signal LCosc1 may increase. Similarly, as the housing 500 bends inwardly, the distances from the sensing coils included in the second and third sensors 120 and 130 to the housing change. While a current flows through the sensing coils of the second and third sensors 120 and 130, a distance from the housing 500, which is a nearby conductor, to the sensing coils of the second and third sensors 120 and 130 changes, thereby changing a magnitude of an eddy current. Inductance changed by the eddy current may then be reduced (Lind−ΔLind), and the oscillation frequency of the second oscillation signal LCosc2 and the oscillation frequency of the third oscillation signal LCosc3 may also increase.

The detecting circuit 600 may analyze the first, second, and third oscillation signals LCosc1, LCosc2, and LCosc3 to determine whether a touch input by a user is normally applied to the touch switch TSW. That is, the detecting circuit 600 compares the oscillation frequencies of the first, second, and third oscillation signals LCosc1, LCosc2, and LCosc3 in accordance with the touch input applied to the electronic device 10 to determine whether the touch input is normal or a malfunction.

As an example, when a touch input is applied to the touch switch TSW as illustrated in FIG. 7, an amount by which the inductance of the first sensor 110 is reduced is measured to be larger than the amounts by which the inductances of the second and third sensors 120 and 130 are reduced. In this regard, as illustrated in FIG. 6, the oscillation frequency of the first oscillation signal LCosc1 may increase by a larger amount than the amounts by which the oscillation frequencies of the second and third oscillation signals LCosc2 and LCosc3 increase. The detecting circuit 600 may then distinguish the sensor showing the oscillation frequency increased by a larger amount as the first sensor 110 and determines the touch input to be a normal touch input.

When the touch input is determined to be a normal touch input, the detecting circuit 600 may generate an input signal in accordance with the corresponding touch input and transfer the generated input signal to the control module 60 of the electronic device 10. In contrast, when the touch input is determined to be a touch input due to a malfunction, the detecting circuit 600 may not generate an input signal.

Accordingly, as illustrated in FIG. 7, in a case in which a plurality (e.g., three or more sensors) are included in the touch sensing device 50-2, the oscillation signals generated by the plurality of sensors are compared to determine whether a touch input is normal. The detecting circuit 600 calculates force values from the plurality of the oscillation signals in accordance with the touch input and determines the touch input to be a normal touch input when the force value sensed by the first sensor 110 is the largest among all calculated force values.

Figure 8:
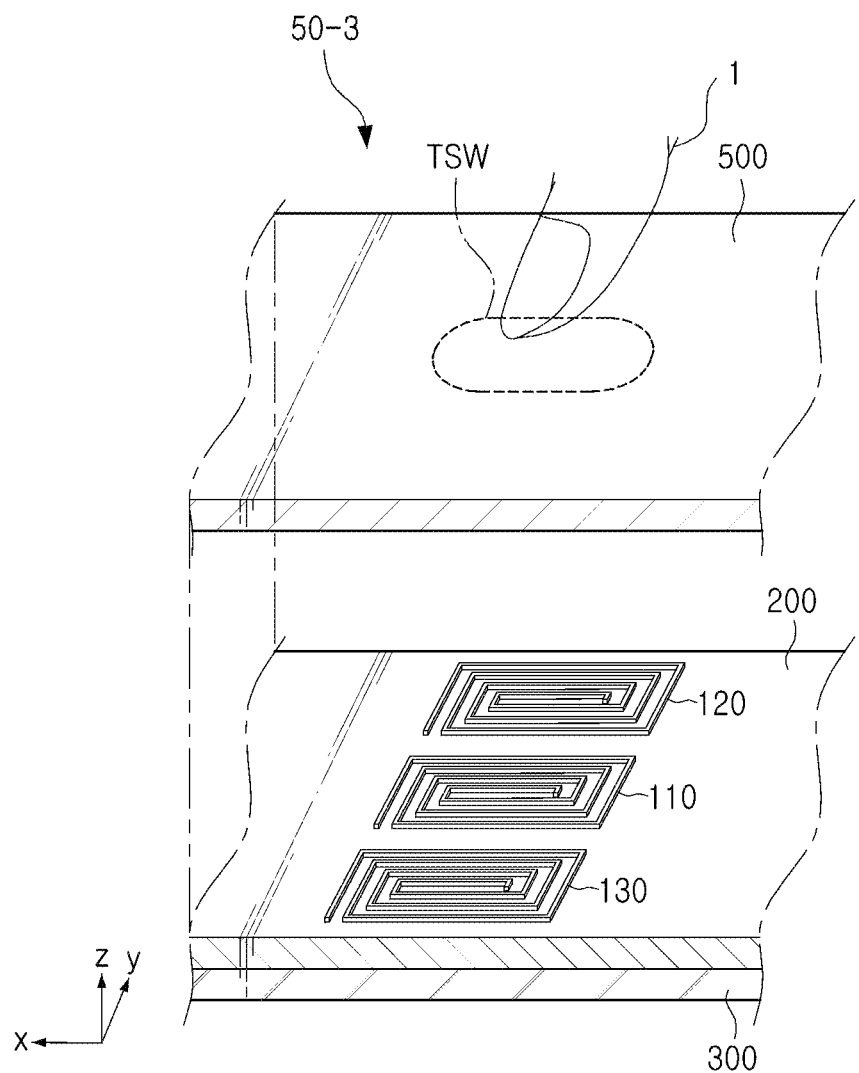
FIG. 8 is a partial perspective view of a touch sensing device, according to an embodiment.

FIG. 8 is a partial perspective view of a touch sensing device 50-3, according to an embodiment. Specifically, in the touch sensing apparatus 50-3, the first, second and third sensors 110, 120, and 130 are disposed side-by-side in a direction perpendicular to a direction in which the housing 500 extends on one side surface of the electronic device 10.

In the embodiment of FIGS. 6 and 7, the first and second sensors 110 and 120 may be disposed side-by-side in the direction in which the housing 500 extends. The touch sensing portion TSP and the malfunction sensing portion MSP determined according to a position of the touch switch TSW may be distinguished along the direction in which the housing 500 extends.

In contrast, as illustrated in FIG. 8, the first, second, and third sensors 110, 120, and 130 may be disposed side-by-side in the direction perpendicular to the direction in which the housing 500 extends. That is, a plurality of sensors may be disposed on one side surface of the electronic device 10, in a vertical direction including the housing 500, a display glass 52 and a rear cover 53. In this case, the touch sensing portion TSP and the malfunction sensing portion MSP may be distinguished along the direction toward the display glass 52 or the rear cover 53.

As an example, referring to FIG. 8, when a user normally applies a touch input to the touch switch TSW, a distance between the first sensor 110 and the housing 500 is reduced by a larger degree. A distance between the housing 500 and the second and third sensors 120 and 130 is reduced by a smaller degree.

Even when a user applies strong pressure to the display glass 52 or the rear cover 53, instead of the touch switch TSW, an effect of the pressure may be applied to the housing 500. In this case, stronger pressure by the user is applied to a portion close to the display glass 52 or the rear cover 53 as compared to a center portion of the housing 500. Accordingly, a distance change between the housing 500 and the second or third sensor 120 or 130 may be measured to be greater than a distance change between the housing 500 and the first sensor 110.

The detecting circuit 600 determines that a normal touch input is applied when a force value sensed by the first sensor 110 is the largest and that a touch input is a malfunction when a force value sensed by the second or third sensor 120 or 130 is the largest. In this regard, even when a user applies strong pressure to the display glass 52 or the rear cover 53, instead of the housing 500, the touch sensing apparatus 50-3 may distinguish the touch input as a touch due to a malfunction.

Figure 9A:
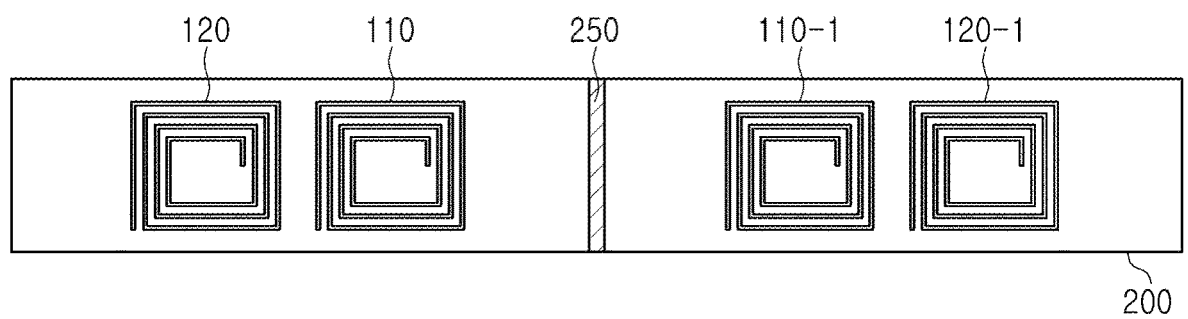
FIGS. 9A and 9B are diagrams illustrating dispositional relationships of sensors in an electronic device including a plurality of touch switches, according to embodiments.
Figure 9B:
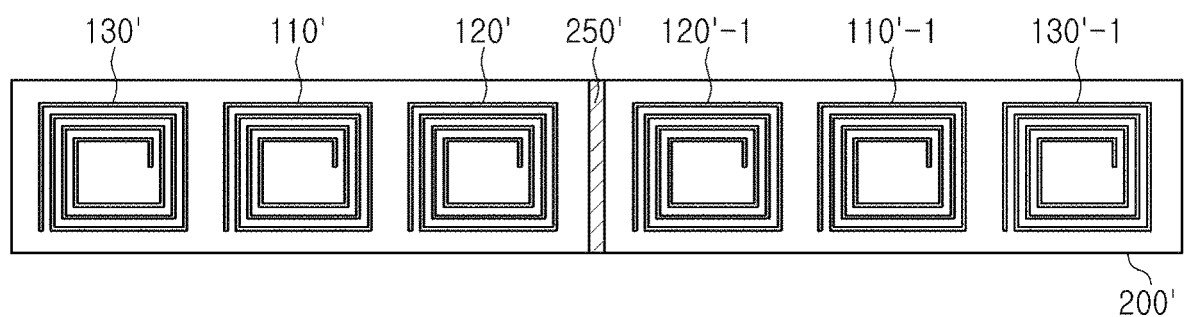

FIGS. 9A and 9B are diagrams illustrating dispositional relationships of sensors in the electronic device 10 including a plurality of touch switches TSW, according to embodiments.

The electronic device 10 may include a plurality of touch switches TSW. Further, the electronic device 10 may be configured to distinguish a normal touch input from a touch input due to a malfunction by including a plurality of sensors for the plurality of the touch switches TSW. In this case, the touch sensing apparatus 50 may include a plurality of first sensors 110, which are spaced apart from each other. Each of the first sensors 110 senses a touch input for a separate touch switch TSW.

A plurality of second sensors 120 may be disposed adjacent to the plurality of the first sensors 110. That is, a plurality of sensors including the first and second sensors 110 and 120 may be provided for a plurality of touch switches TSW.

FIGS. 9A and 9B illustrate arrangements of a plurality of sensors included in the electronic device 10, in an example in which the electronic device includes two touch switches TSW. FIG. 9A illustrates an arrangement of two sensors for each touch switch TSW. That is, for example, the first and second sensors 110 and 120 disposed on the left may correspond to a touch switch TSW having a volume-up function of the electronic device 10 while a second-first sensor 110-1 and a second-second sensor 120-1 disposed on the right may correspond to a touch switch TSW having a volume-down function. In many cases, a user touches an outer area of the touch switch TSW. In this regard, as illustrated in FIG. 9A, the first sensors 110 and 110-1 are configured as inner sensors and the second sensors 120 and 120-1 are configured as outer sensors. However, this is merely an example, and the inner and outer sensors may be disposed in reverse, and inner and outer directions for the touch switches TSW may be different from each other.

Further, referring to FIG. 9A, a masking member 250 may further be provided between a plurality of the sensors. For example, the masking member 250 may be provided on the substrate 200. The masking member 250 may block the changing signal of each sensor such that the sensors corresponding to different touch switches do not affect each other. That is, when a user applies pressure to the touch switch TSW having the volume-up function, no force is delivered to the first and second sensors 110 configured to distinguish a normal touch input and a malfunction of the volume-down function. However, the masking member 250 is not necessarily provided in the touch sensing apparatus 50.

FIG. 9B illustrates three sensors disposed in each touch switch TSW. That is, for example, a first sensor 110', a second sensor 120' and a third sensor 130' disposed on the left may correspond to the touch switch TSW having the volume-up function of the electronic device 10, and a second-first sensor 110'-1, a second-second sensor 120'-1 and a second-third sensor 130'-1 disposed on the right may correspond to the touch switch TSW having the volume-down function. As illustrated in FIG. 9B, the first sensor 110' and the second-first sensor 110'-1 are configured as central sensors, the second and third sensors 120' and 130' are disposed on both sides of the first sensor 110', and the second-second sensor 120'-1 and the second-third sensor 130'-1 are disposed on both sides of the second-first sensor 110'-1. In this case, pressure abnormally applied to the left or right side of the touch switch TSW may be determined as a touch due to a malfunction.

According to the embodiments disclosed herein, a device and method for touch sensing may determine a force applied to a portion other than a touch switch as a malfunction.

According to the embodiments disclosed herein, the device and method for touch sensing may widen a range of a region that can be identified as a malfunction in front, rear, left and right directions with respect to the touch switch as a center.

The control module 60 in FIGS. 1 to 9B that performs the operations described in this application is implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 9B that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device, comprising:
   a substrate disposed in a housing;
   a first sensor disposed on the substrate, in a normal touch sensing portion;
   a second sensor disposed on the substrate, in a malfunction touch sensing portion; and
   a sensing circuit electrically connected to the first sensor and the second sensor,
   wherein the sensing circuit is configured to compare signals sensed by the first sensor and the second sensor in accordance with an applied touch input and determine whether the applied touch input is normal, and
   wherein the first and second sensors are disposed adjacent to each other in a direction from a front display disposed on one side of the housing to a rear cover disposed on another side of the housing opposite the one side.

2. The touch sensing device of claim 1, wherein the sensing circuit comprises a first oscillator circuit and a second oscillator circuit, and
   wherein the first oscillator circuit is configured to generate a first oscillation signal from a change sensed by the first sensor, and the second oscillator circuit is configured to generate a second oscillation signal from a change sensed by the second sensor.

3. The touch sensing device of claim 2, wherein the sensing circuit further comprises a detecting circuit configured to compare the first and second oscillation signals to determine whether the applied touch input is normal.

4. The touch sensing device of claim 3, wherein the detecting circuit is further configured to calculate first and second force values from the first and second oscillation signals, respectively, and compare the first and second force values to determine whether the applied touch input is normal or a malfunction.

5. The touch sensing device of claim 4, wherein the detecting circuit is further configured to determine that the applied touch input is normal, in response to the first force value being greater than the second force value.

6. The touch sensing device of claim 4, wherein the detecting circuit is further configured to determine that the applied touch input is normal, in response to the first force value being greater than a predetermined reference value.

7. The touch sensing device of claim 1, wherein the first sensor and the second sensor are disposed side-by-side in a direction in which a housing extends.

8. The touch sensing device of claim 1, wherein the malfunction touch sensing portion does not overlap with a touch switch.

9. The touch sensing device of claim 1, further comprising a third sensor disposed on the substrate, and
   wherein the first sensor is disposed between the second sensor and the third sensor.

10. The touch sensing device of claim 1, wherein the first sensor comprises a plurality of first sensors, and
    wherein the plurality of first sensors are spaced apart from each other.

11. The touch sensing device of claim 10, wherein a plurality of sensors comprising the second sensor are disposed close to the plurality of first sensors, respectively.

12. A method for touch sensing, comprising:
    generating a first oscillation signal and a second oscillation signal by a first sensor and a second sensor, respectively, in accordance with an applied touch input; and
    determining whether the applied touch input is normal by comparing the first and second oscillation signals, wherein the first and second oscillation signals have resonance frequencies that vary in accordance with the applied touch input, wherein the first sensor is disposed in a normal touch sensing portion, and the second sensor is disposed in a malfunction touch sensing portion, and wherein the first and second sensors are disposed in a housing of an electronic device, such that the first and second sensors are positioned adjacent to each other in a direction from a front display disposed on one side of the housing to a rear cover disposed on another side of the housing opposite the one side.

13. The method of claim 12, wherein the determining of whether the applied touch input is normal by comparing the first and second oscillation signals comprises:
calculating first and second force values from the first and second oscillation signals, respectively; and
determining whether the applied touch input is normal or a malfunction by comparing the first and second force values.

14. The method of claim 13, wherein the determining of whether the applied touch input is normal or the malfunction comprises determining that the applied touch input is normal, in response to the first force being greater than the second force value.

15. The method of claim 13, wherein the determining of whether the applied touch input is normal or the malfunction comprises determining that the applied touch input is normal, in response to the first force value being greater than a predetermined reference value.

16. The method of claim 13, further comprising:
generating at least one additional oscillation signal by at least one additional sensor, in accordance with the applied touch input; and
calculating at least one additional force value from the at least one additional oscillation signal,
wherein the determining of whether the applied touch input is normal or the malfunction comprises determining that the applied touch input is normal, in response to the first force value being largest among the first force value, the second force value, and the at least one additional force value.

17. The method of claim 12, further comprising generating an input signal to be delivered to a controller, in response to determining that the applied touch input is normal.

18. The method of claim 12, further comprising determining not to generate an input signal to be delivered to a controller, in response to determining that the applied touch input is a malfunction.

* * * * *